United States Patent [19]
Nomura et al.

[11] Patent Number: 5,297,003
[45] Date of Patent: Mar. 22, 1994

[54] COMPUTER, KEYBOARD APPARATUS, AND KEYBOARD TILTING MECHANISM

[75] Inventors: Hideo Nomura, Yokohama; Yoshiharu Uchiyama, Isehara, both of Japan

[73] Assignee: International Business Machines Corporation, Armonk, N.Y.

[21] Appl. No.: 958,062

[22] Filed: Oct. 8, 1992

[30] Foreign Application Priority Data

Nov. 10, 1991 [JP] Japan ................... 3-290406

[51] Int. Cl.⁵ .......................... H05K 5/02; G06F 1/16
[52] U.S. Cl. ..................................... 361/680; 108/133;
248/685; 248/918; 400/681; 400/691
[58] Field of Search ............... 108/133; 312/351.7;
248/685, 688, 918; 341/22; 340/711; 400/472,
681, 682, 691, 692, 693; 235/1 D, 145 R, 146;
361/380, 390–395, 399, 680; 364/708, 708.1;
345/168, 169, 905

[56] References Cited

U.S. PATENT DOCUMENTS

| | | | |
|---|---|---|---|
| 4,516,508 | 5/1985 | Kako et al. .................. | 108/7 |
| 4,527,149 | 7/1985 | Swensen ................... | 400/682 X |
| 4,658,124 | 4/1987 | Berting .................... | 400/681 X |
| 4,735,394 | 4/1988 | Facco ...................... | 400/682 X |

FOREIGN PATENT DOCUMENTS

59-100331 7/1984 Japan .
60-140134 9/1985 Japan .

*Primary Examiner*—Leo P. Picard
*Assistant Examiner*—Michael W. Phillips
*Attorney, Agent, or Firm*—Michael E. Blek

[57] ABSTRACT

In a computer comprising a computer body for supporting a keyboard and enclosing electronic circuits, several elements are provided including recesses provided on the bottom side of the computer body, leg members for tilting the computer body, the leg members being positioned in the recesses and being rotatable around a supporting shaft of the leg members and slidable along the direction of the axis of the supporting shaft, a spring for forcing the leg members to rotate so as to open from the recesses and to slide in one direction along the supporting shaft, and engagement apparatus for engaging the leg members with the recesses in spite of the force caused by the spring to rotate the leg members, handling portions for facilitating the slide manipulation of the leg members along the supporting shaft are provided on the exposed surface of the leg members while in the recesses, so that it becomes unnecessary to provide additional members for manipulation.

12 Claims, 5 Drawing Sheets

COMPUTER, KEYBOARD APPARATUS, AND KEYBOARD TILTING MECHANISM

DETAILED DESCRIPTION OF THE INVENTION

This invention relates to a keyboard apparatus and a computer with an integrated keyboard, and more particularly to a keyboard tilting mechanism.

BACKGROUND OF THE INVENTION

An example of conventional keyboard tilting mechanism is constructed such that leg members for adjusting the angle of a keyboard are provided rotatably to a keyboard body, the leg members are forced to move in one direction along the direction and axis of the rotation by a coil spring wound on to the axis of the rotation by the leg members, and the force of said coil spring along the direction of the rotation to the leg members is prevented and released. Such a conventional mechanism is described in Japanese Pat. No. 59-113355, 59-100331, and 60-140134. However, such a conventional mechanism is provided with different members for manipulation from the leg members in order to prevent or release the force of said coil spring. Thus its construction is complex, its assembly is difficult, and its operation is inconvenient. Besides, if different members for manipulation from the leg members project, for example, from the side of a keyboard body, they are inconvenient for storage and conveyance, especially, for a notebook computer and the like.

SUMMARY OF THE INVENTION

An object of the present invention is to provide a keyboard tilting apparatus and a keyboard apparatus and computer having a keyboard tilting mechanism whose construction is simple, assembly is easy, and operation and storage are convenient.

In order to accomplish said object, in a computer including a computer or system body for supporting a keyboard and having internally formed electronic circuits, recesses provided on the bottom side of said computer body, leg members for tilting said computer body, said leg members being provided in said recessions and being rotatable around a supporting shaft which is provided to said leg members and slidable along the direction of the axis of said supporting shaft, spring means for forcing said leg members to rotate so as to open from said recesses and to slide in one direction along said supporting shaft, and engagement means for engaging said leg members with said recesses in spite of the force caused by said spring means to rotate said leg members, the present invention is intended to provide handling portions for facilitating the slide manipulation of the leg members along said supporting shaft on the exposed surface of said leg members from said recessions, so that it unnecessary to provide dedicated members for manipulation from the leg members.

Further, a keyboard apparatus according to the present invention is provided with a keyboard, a body for supporting said keyboard, recesses provided on the bottom side of said body, leg members for tilting said body, said leg members being provided in said recess and being rotatable around a supporting shaft which is provided to said leg members and slidable along the direction of the axis of said supporting shaft, spring means for forcing said leg members to rotate so as to open from said recesses and to slide in one direction along said supporting shaft, and engagement means for engaging said leg members with said recessions in spite of the force caused by said spring means to rotate said leg members, and is intended to provide handling portions for facilitating the slide manipulation of said leg members along said supporting shaft on the exposed surface of the leg members from said recesses, so that it becomes unnecessary to provide different members for manipulation from the leg members.

Still further, a keyboard tilting mechanism according to the present invention is provided with a body for supporting a keyboard, recesses provided on the bottom side of said body, leg members for tilting said body, said leg members being provided in said recessions and being rotatable around a supporting shaft which is provided to said leg members and slidable along the direction of the axis of said supporting shaft, spring means for forcing said leg members to rotate so as to open from said recesses and to slide in one direction along said supporting shaft, and engagement means for engaging said leg members with said recesses in spite of the force caused by said spring means to rotate said leg members, and is intended to provide handling portions for facilitating the slide manipulation of said leg members along said supporting shaft on the exposed surface of the leg members from said recessions, so that it becomes unnecessary to provide different members for manipulation from the leg members.

Figure 1:
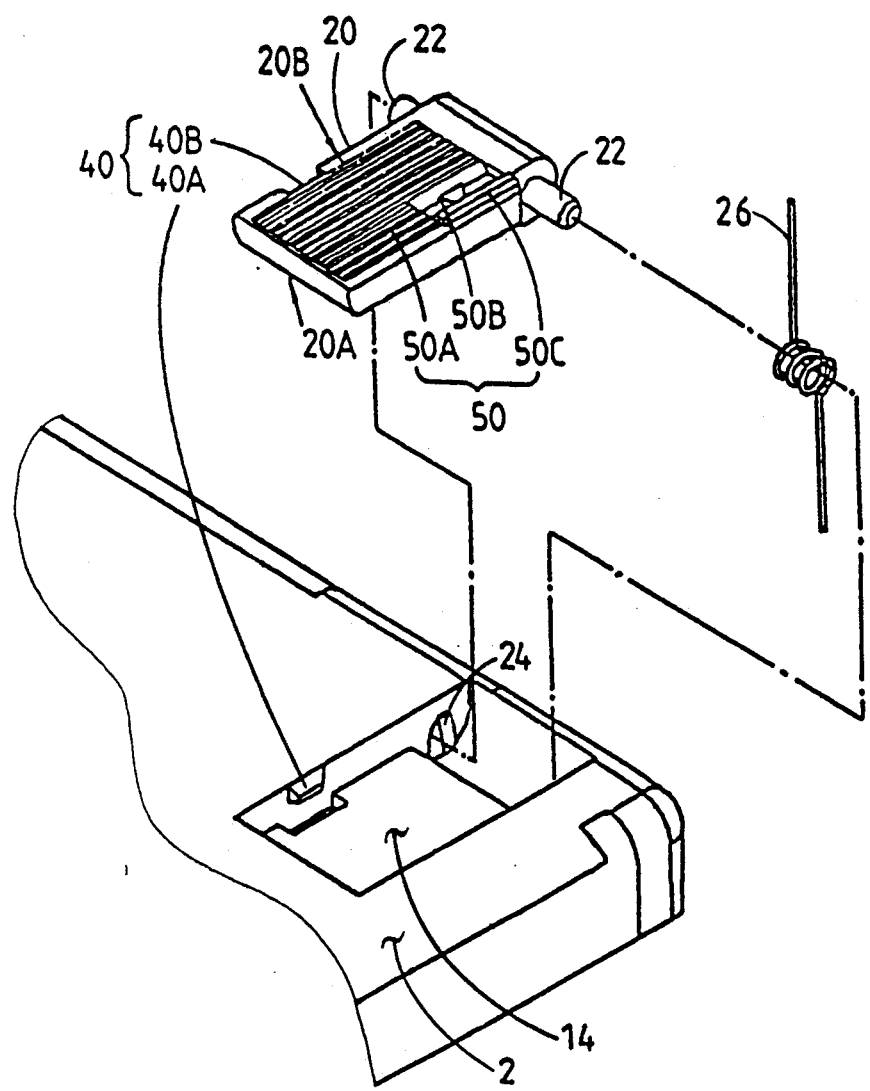
FIG. 1 is an exploded perspective view showing the construction of main parts of an embodiment of a computer according to the present invention.

In the drawings, parts are identified as follows:

2 ... Computer body
4 ... Cover
6 ... Display apparatus
8 ... Keyboard
10 ... Keyboard tilting mechanism
12 ... Bottom side of computer body
14 ... Recess for accommodating leg members
20 ... Leg members
20B ... Exposed surface of leg members
22 ... Supporting shaft
24 ... Bearing section
26 ... Coil spring as spring means
40 ... Engagement means
40A ... Engagement convexity
40B ... Engagement recess
50 ... Handling portion
50A ... Non-skid surface
50B ... Handling recession 50C... Handling convexity

DETAILED DESCRIPTION OF DRAWINGS

Figure 2:
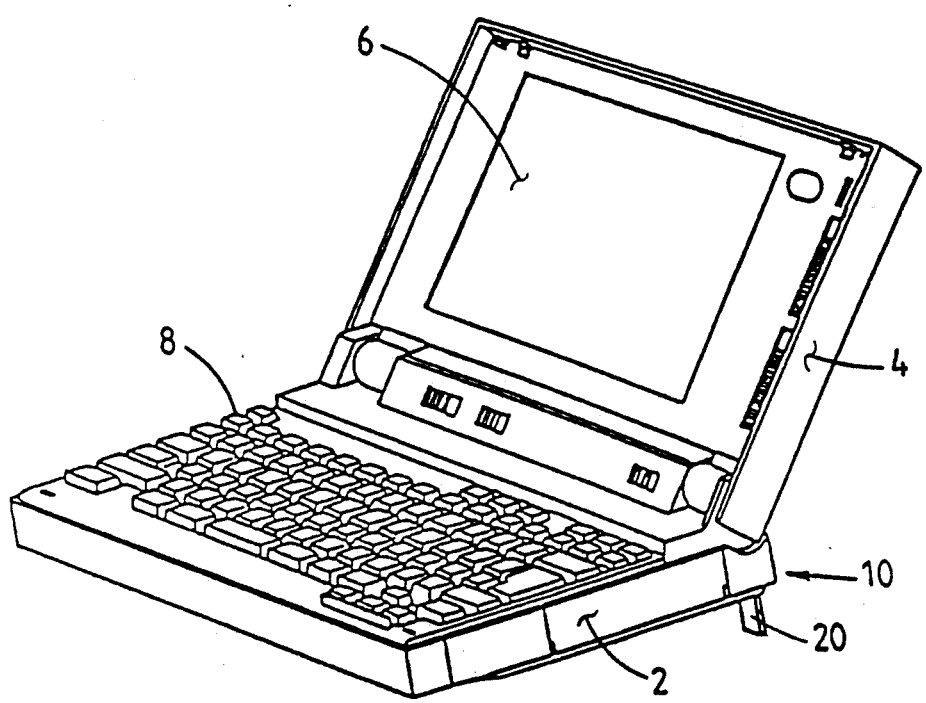
FIG. 2 is a perspective view showing the whole construction of said embodiment.

In the following, an embodiment of the present invention is described by reference to drawings. FIG. 2 shows the whole construction of an embodiment of a computer according to the present invention. Fixed to a computer body 2 is a cover 4, which is capable of opening and shutting, and a display device 6 such as a LCD is provided inside the cover 4. The computer body 2 includes unillustrated electronic circuit 5, a keyboard 8 is supported on the top side of said body, and a keyboard tilting mechanism 10 is provided on the bottom side at the back of the computer body 2.

Figure 3:
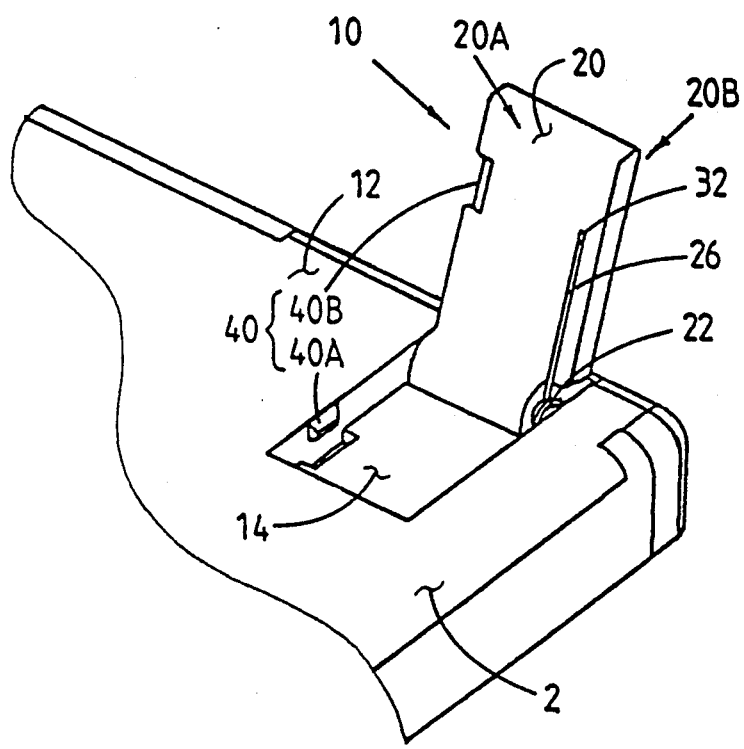
FIG. 3 is a perspective view showing the main parts of said embodiment in the state where the leg members are opened.
Figure 4:
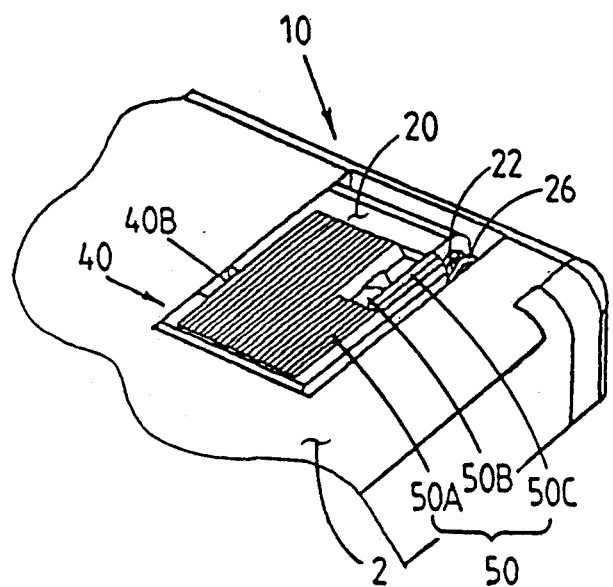
FIG. 4 is a perspective view showing the main parts of said embodiment in the state where the leg members are closed.
Figure 5:
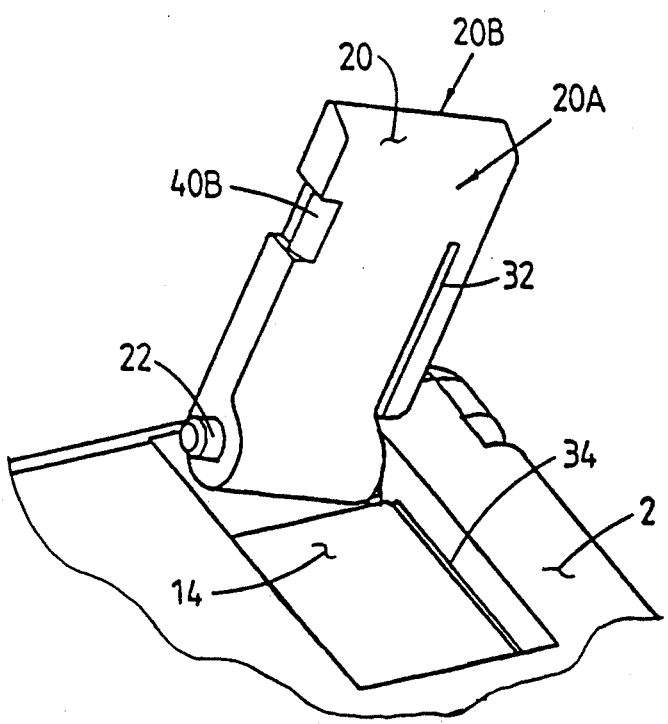
FIG. 5 is a perspective view showing the main parts of said embodiment in the state where the leg members are being mounted in recesses.

Referring to FIG. 3 in which the keyboard tilting mechanism 10 is magnified, a recess 14 is formed integrally on a component member of the bottom side 12, on the bottom side 12 of the computer body 2, and a leg member 20 is rotatably provided in the recess 14. FIG. 4 shows a state where the leg member 20 is accommodated in the recess 14, FIG. 5 shows a state seen when the leg member 20 is installed in the recess 14, and FIG. 1 is an exploded view of the keyboard tilting mechanism 10. In these figures, a supporting shaft 22 is provided through both side walls at one end in the longitudinal direction of the leg member 20. Provided within the recess 14 is a bearing section 24, on which the supporting shaft 22 is mounted so as to be rotatable and slidable along the direction of the axis of the supporting shaft 22.

Wound around the supporting shaft 22 near an end of the computer body 2, which is provided through both side walls of the leg member 20 is a coil spring 26 as a spring means. The coil spring 26 forces the leg member 20 to move to the center from the end of the computer body 2 along the direction of the axis of the supporting shaft 22 and to open from the recess 14. While a spring guide groove 32 is formed on the inside 20A of the leg member 20, a spring guide groove 34 (shown in FIG. 5) is formed on the bottom side of the recess 14, so that both ends of the coil spring 26 are held in the spring guide grooves 32 and 34, respectively.

On the opposite side from the coil spring 26 of the leg member 20 an engagement means 40 is provided at the edge. The engagement means 40 is composed of an engagement convexity 40A and an engagement recess 40B. The engagement convexity 40A is formed on a side wall of the recess 14, and the engagement recess 40B is formed at the confronting position of the leg members 20 to the engagement convexity 40A. As shown in FIG. 4, in the state where the leg member 20 is accommodated in the recess 14 (the state where the leg member 20 is closed), in spite of the force caused by the coil spring 26 to open the leg member 20 from the recess 14, engagement between the engagement convexity 40A and the engagement recession 40B is maintained because the coil spring 26 pushes the leg member 20 against a side wall of the recess 14, so that the state where the leg member 20 is closed is maintained. The areas in which the engagement convexity 40A and the engagement recess 40B come into contact each other in the process in which the leg member 20 rotates from the opened state to the closed state, are tapered in order to make it easy for the engagement recess 40B to get over the engagement convexity 40A.

Provided on an outside 20B, which is the exposed surface of the leg member 20 from the recess 14 is a handling portion 50. The handling portion 50 is for facilitating the slide manipulation of the leg member 20 against the force of the coil spring 26. The handling portion 50 is composed of a non-skid surface 50A, a handling recession 50B, and a handling convexity 50C. The non-skid surface 50A is formed by ridging almost all over the outside 20B. The handling convexity 50C, a projection formed near an end of the outside 20B, is a finger hold for sliding the leg member 20 against the spring coil 26 using a finger tip. Besides, the handling recess 50B, a recess adjacent to the handling convexity 50C, is for facilitating the catching of a finger tip to the handling convexity 50C by making the handling convexity 50C substantially higher.

Figure 6:
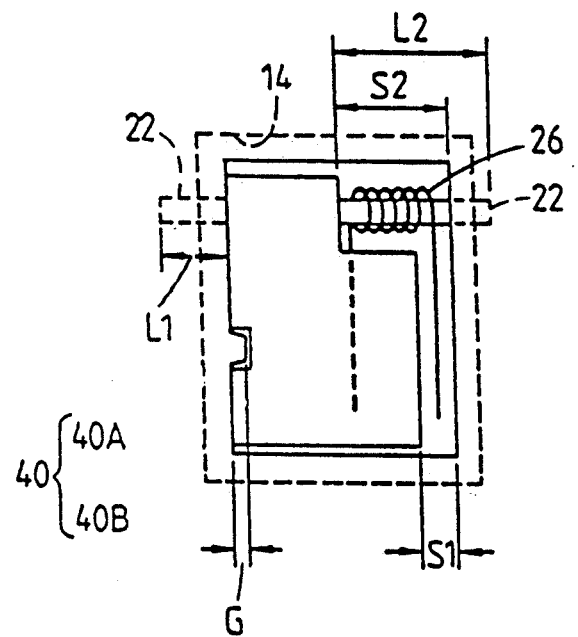
FIG. 6 is a top view showing an example of dimensional relations of each part of said leg members.

FIG. 6 shows an example of dimensional relations of each part in the state where the leg member 20 is accommodated in the recess 14. Now it is assumed that the length of the supporting shaft 22 around which the spring coil 26 is not wound is L1 and the length of the supporting shaft 22 around which the spring coil 26 is wound is L2; in the state where the leg member 20 is pushed against one side wall of the recess 14 by the spring coil 26, the height of the engagement convexity 40A (the length in the slide direction of the leg member 20) is G, the length between the leg member 20 and the other side wall of the recess 14 (the slidable distance of the leg member 20) is S1, and the length of the supporting shaft 22 around which the spring coil 26 is wound in the recess 14 is S2; the length of the spring coil 26 when compressed most in the direction of the axis of the supporting shaft 22 is K.

Then inequalities $(S2-K) > L1 > S1 > G$ and $L2 > S2$ hold. When the leg member 20 is slid by the distance more than G from the state where the leg member 20 is closed (the state shown in FIG. 6), the engagement recess 40B comes off the engagement convexity 40A and the leg member 20 rotates so that it rises from the recess 14, that is, the leg member 20 will open. When the leg member 20 is further slid by the distance more than L1 from the state where the leg member 20 is opened, the leg member 20 can be removed from the recession 14 since the supporting shaft 22 around which the spring coil 26 is not wound comes off the bearing section 24. As shown in FIG. 5, it is possible to mount the leg member 20 on the recession 14, in the state where the leg member 20 rises from the recess 14, by mounting first the supporting shaft 22 around which the spring coil 26 is wound, on the bearing section 24 by compressing the spring coil 26, and then by mounting also the supporting shaft 22 around which the spring coil 26 is not wound, on the bearing section 24.

Figure 7:
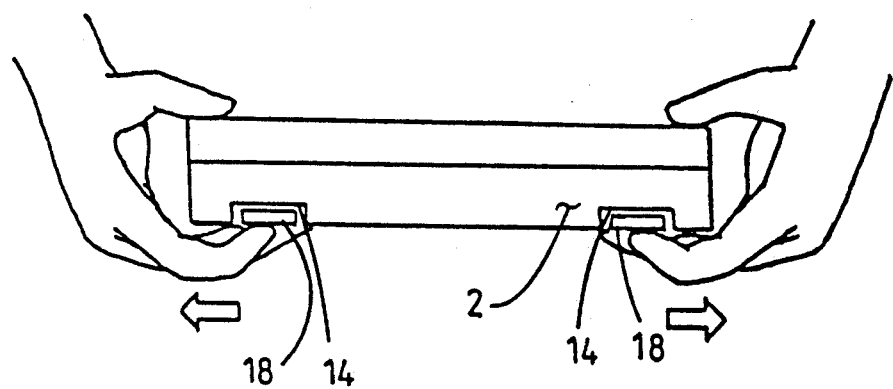
FIG. 7 is a back view showing the manipulation for opening the leg members of said embodiment.

According to the embodiment described above, as shown in FIG. 7, the leg member 20 can be easily opened if both sides of the back of the computer body 2 are held with both hands in the state where the computer body 2 is usually used and if the handling portions 50 of the leg members 20 are slid outwards the computer body 2 using, for example, the forefinger or the middle finger which is on the bottom side 12. Also, the leg members 20 can be easily closed using the same manipulation.

Further, according to the embodiment described above, since different members for manipulation from leg members do not project, for example, on the side of a computer body, such a computer is convenient for storage and conveyance. In addition, since any parts for holding and manipulating the leg members are not arranged inside of the computer body, there is no possibility that the breakage of such parts causes the failure in electronic circuits formed inside of the computer body.

Still further, even if the tip of a supporting shaft is arranged inside of the computer body, there is no possibility that the breakage of the supporting shaft will cause failure in the electronic circuits inside of the computer body because the supporting shaft will not come off the leg members.

Further, in said embodiment, the present invention is applied to a computer with an integrated keyboard. However, it will be appreciated that the present invention may be also applied to a keyboard apparatus. Still further, in said embodiment, the recession 14 in which the leg members 20 are accommodated is formed integrally at least with the computer body 2 around the recess 14. However, it will be appreciated that recesses may be formed separately from a computer body, leg members mounted in the recesses, and then the recesses installed in the computer body. Further, in said embodiment, dimensional relations of each part of the leg members 20 are as described above, the leg members 20 can be mounted on and detached from the recessions 14, and the coil spring 26 prevents the leg members 20 from falling off from the recesses 14 after being mounted. However, it will be appreciated that the dimensional relations of leg members may be applied not only to the case described above, but also to the case of such construction that leg members cannot be detached from recesses after the leg members are mounted on the recesses. In said embodiment, the handling portions 50 are composed of the non-skid surface 50A, the handling recession 50B, and the handling convexity 50C. However, it will be appreciated that handling portions may be composed of only some of the disclosed parts, for example, a groove provided on the center of the exposed surface of leg members, in short, any structure which facilitates the slide manipulation of the leg members.

ADVANTAGES OF THE INVENTION

As described above, according to the present invention, a keyboard tilting mechanism and a keyboard apparatus and computer having a keyboard tilting mechanism whose construction is simple, assembly is easy, and operation and storage are convenient can be provided.

What is claimed is:

1. A computer having:
   computer body means for enclosing electronic circuits and including a computer body;
   a keyboard supported by a top side of said body;
   recesses in a bottom side of said computer body;
   leg means, including leg members, for sliding to one side of the recesses and for rotating about an axis for extending the leg members from the recesses to support and tilt the computer body;
   spring means for biasing said leg members to rotate about said axis so as to open and extend from said recesses and to slide in a first direction of said axis;
   engagement means for selectively engaging said leg members with said recesses to hold the leg members in the recesses in spite of the force caused by said spring means to rotate said leg members and for selectively releasing said engagement to extend the leg members from the recesses; and
   handling means for sliding said leg members along an opposite, second direction of said axis for releasing said engagement means to extend said leg members from said recesses, including handling portions provided on an exposed surface of said leg members in said recesses.

2. The computer according to claim 1, wherein said body includes side walls integral with said bottom side which define said recesses.

3. The computer according to claim 1, wherein said leg member means include means for assembly into said recesses from said bottom side and for communicating with said spring means to prevent said leg members from dropping out of said recesses.

4. The computer according to claim 1, further including:
   a shaft integral with said leg member means; and wherein p1 said spring means include a short coil spring wound around said shaft, the length of said coil spring when compressed in the direction of said shaft is sufficiently short to allow said leg members to be assembled into said recesses.

5. A keyboard apparatus having:
   a keyboard;
   a body for supporting said keyboard;
   recesses on a bottom side of said body;
   leg member means for supporting and tilting said body, and including: leg members being provided in said recesses, and shafts connected to said leg members and rotatably and slidably connected to the body to allow the shafts and leg members to rotate abut a central axis of said shaft and to slide along the direction of the axis of said shaft;
   spring means for biasing said leg members to rotate so as to open from said recesses and to slide in one direction along said shaft;
   engagement means for selectively engaging said leg members with said recesses in spite of the force caused by said spring means to rotate said leg members and for selectively releasing said engagement; and
   handling portion means for sliding said leg members along said shaft for releasing said engaging means, integral with an exposed surface of said leg members in said recesses.

6. A keyboard tilting mechanism having:
   body means for supporting a keyboard;
   recesses provided on the bottom side of said body;
   leg members for tilting said body, positioned in said recesses
   shafts fixed to said leg members and slidably and rotatably connected in the recesses for said shafts and leg members to rotate in and out of the recesses and to slide along the direction of an axis of said shaft;
   spring means to produce a spring force for biasing said leg members to rotate so as to open from said recesses and to slide in one direction along said shaft;
   engagement means for selectively engaging said leg members with said recesses and to hold the leg members within the recesses in spite of the force caused by said spring means to rotate said leg members and for selectively releasing said engagement; and
   handling portions for sliding the leg members along said shafts, in a direction opposite to the direction of the spring force in spite of the spring force for releasing said engagement, and positioned on an exposed surface of said leg members in said recesses.

7. The keyboard according to claim 5, wherein said body includes side walls integral with said bottom side which define said recesses.

8. The keyboard according to claim 5, wherein said leg members include means for assembly into said recesses from said bottom side and for communicating with said spring means to prevent said leg members from dropping out of said recesses.

9. The keyboard according to claim 5, further including:
a shaft integral with said leg members; and wherein said spring means include a short coil spring wound around said shaft, the length of said coil spring when compressed in the direction of said shaft is sufficiently short to allow said leg members to be assembled into said recesses.

10. The tilting mechanism according to claim 6, wherein said body includes side walls integral with said bottom side which define said recesses.

11. The tilting mechanism according to claim 6, wherein said leg members include means for assembly into said recesses from said bottom side and for communicating with said spring means to prevent said leg members from dropping out of said recesses.

12. The tilting mechanism according to claim 6, further including:
a shaft integral with said leg members; and wherein said spring means include a short coil spring wound around said shaft, the length of said coil spring when compressed in the direction of said shaft is sufficiently short to allow said leg members to be assembled into said recesses.

* * * * *